(12) United States Patent
Cheng et al.

(10) Patent No.: US 12,341,143 B2
(45) Date of Patent: Jun. 24, 2025

(54) DEVICE SUBSTRATE AND MANUFACTURING METHOD THEREOF

(71) Applicant: AUO Corporation, Hsinchu (TW)

(72) Inventors: Yun Cheng, Hsinchu (TW); Hsi-Hung Chen, Hsinchu (TW); Hao-An Chuang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 200 days.

(21) Appl. No.: 18/087,825

(22) Filed: Dec. 23, 2022

(65) Prior Publication Data
US 2024/0186305 A1    Jun. 6, 2024

(30) Foreign Application Priority Data
Dec. 1, 2022 (TW) ................................. 111146071

(51) Int. Cl.
| | | |
|---|---|---|
| H05K 1/11 | (2006.01) | |
| H01L 25/16 | (2023.01) | |
| H05K 1/18 | (2006.01) | |
| H10H 20/857 | (2025.01) | |
| H10K 59/80 | (2023.01) | |
| H10K 59/82 | (2023.01) | |
| H10K 59/90 | (2023.01) | |
| H10K 59/10 | (2023.01) | |

(52) U.S. Cl.
CPC ......... H01L 25/167 (2013.01); H10H 20/857 (2025.01); H10K 59/82 (2023.02); H10K 59/873 (2023.02); H10K 59/90 (2023.02); H05K 1/11 (2013.01); H05K 1/18 (2013.01); H10K 59/10 (2023.02)

(58) Field of Classification Search
CPC .............. H01L 25/167; H01L 21/4846; H01L 21/4853; H01L 21/56; H01L 23/12; H01L 23/31; H01L 23/5386; H01L 25/0753; H10H 20/857; H10K 59/82; H10K 59/873; H10K 59/90; H10K 59/10; A01N 1/146; G06F 11/3698; H10D 30/509; H10D 30/0295
See application file for complete search history.

(56) References Cited

U.S. PATENT DOCUMENTS

| | | | | |
|---|---|---|---|---|
| 6,492,896 B2 * | 12/2002 | Yoneda | .................. | H01C 7/003 |
| | | | | 338/195 |
| 7,763,982 B2 * | 7/2010 | Liao | ........................ | H05K 3/242 |
| | | | | 257/777 |
| 9,704,621 B2 * | 7/2017 | Ogawa | .................... | H01C 7/003 |

(Continued)

FOREIGN PATENT DOCUMENTS

| | | |
|---|---|---|
| CN | 105428382 | 3/2016 |
| CN | 114122049 | 3/2022 |
| CN | 114388679 | 4/2022 |

Primary Examiner — Ishwarbhai B Patel
(74) Attorney, Agent, or Firm — JCIPRNET

(57) ABSTRACT

A device substrate, including a circuit substrate, a first side wiring, a sealant structure, and a second side wiring, is provided. The first side wiring extends from a first surface of the circuit substrate to a second surface of the circuit substrate along a side surface of the circuit substrate. The sealant structure is located above the first surface and covers the first side wiring on the first surface. The second side wiring extends from the sealant structure to the first side wiring located on the side surface and the second surface of the circuit substrate.

14 Claims, 20 Drawing Sheets

(56) References Cited

U.S. PATENT DOCUMENTS

2014/0326489 A1* 11/2014 Mutnury .............. H05K 1/0246
    174/257
2020/0013846 A1* 1/2020 Kwon .................. H10K 59/131

* cited by examiner

DEVICE SUBSTRATE AND MANUFACTURING METHOD THEREOF

CROSS-REFERENCE TO RELATED APPLICATION

This application claims the priority benefit of Taiwan application serial no. 111146071, filed on Dec. 1, 2022. The entirety of the above-mentioned patent application is hereby incorporated by reference herein and made a part of this specification.

BACKGROUND

Technical Field

The disclosure is related to a device substrate and a manufacturing method thereof.

Description of Related Art

In conventional display panels, a part of the chip and the circuit are disposed on the back surface of the display panel so as to reduce the frame width of the display panel. Generally, a driver chip is integrated into a flexible circuit board through thin-film flip-chip packaging, and then the flexible circuit board is bonded to the pad on the front surface of a pixel array substrate. The flexible circuit board is bent to the back surface of the pixel array substrate, so that the driver chip is disposed on the back surface of the pixel array substrate. However, even if the flexible circuit board is bent to the back surface of the pixel array substrate, the flexible circuit board cannot completely fit the side surface of the pixel array substrate after bending, resulting in the display panel formed eventually still having to retain a certain size of frame width.

SUMMARY

The disclosure provides a device substrate and a manufacturing method thereof, which improves the problems caused by side wiring damage.

At least one embodiment of the disclosure provides a device substrate. The device substrate includes a circuit substrate, a first side wiring, a sealant structure, and a second side wiring. The first side wiring extends from a first surface of the circuit substrate to a second surface of the circuit substrate along a side surface of the circuit substrate. The sealant structure is located above the first surface and covers the first side wiring on the first surface. The second side wiring extends from the sealant structure to the first side wiring located on the side surface and the second surface of the circuit substrate.

At least one embodiment of the disclosure provides a manufacturing method for a device substrate, including the following operation. A first side wiring is formed on a circuit substrate. The first side wiring extends from a first surface of the circuit substrate to a second surface of the circuit substrate along a side surface of the circuit substrate. A sealant structure is formed above the first surface. The sealant structure covers the first side wiring on the first surface, and the first side wiring is damaged before or after forming the sealant structure. A second side wiring is formed to repair the first side wiring damaged. The second side wiring extends from the sealant structure to the first side wiring located on the side surface and the second surface.

At least one embodiment of the disclosure provides a manufacturing method for a device substrate, including the following operation. Multiple first side wirings are formed on a circuit substrate. The first side wiring extends from a first surface of the circuit substrate to a second surface of the circuit substrate along a side surface of the circuit substrate. A sealant structure is formed above the first surface. The sealant structure covers the first side wiring on the first surface. A shorting bar is formed on the first side wirings. A part of the shorting bar extends from the sealant structure to the first side wirings located on the side surface and the second surface. The shorting bar is cut with laser to form multiple second side wirings separated from each other, and the second side wirings are electrically connected to the first side wirings, respectively.

Based on the above, the frame width of the device substrate is reduced by first side wiring. In addition, the first side wiring damaged is also repaired through the second side wiring, so as to improve the problems caused by the damaged side wiring.

DESCRIPTION OF THE EMBODIMENTS

FIG. 1A to FIG. 1E are perspective schematic views of a manufacturing method for a device substrate 1 according to an embodiment of the disclosure. FIG. 2A to FIG. 2E are cross-sectional schematic views at the line A-A' of FIG. 1A to FIG. 1E, respectively. The circuit layout in the circuit substrate 10 is omitted in FIG. 1E to FIG. 2E, and the circuit layout in the circuit substrate 10 is modified according to actual requirements. Specifically, the circuit substrate 10 includes, for example, a substrate (not shown) and a circuit structure (not shown) on the substrate. The circuit structure includes multiple conductive layers and multiple insulating layers. In some embodiments, the circuit structure further includes active devices.

Figure 1A:
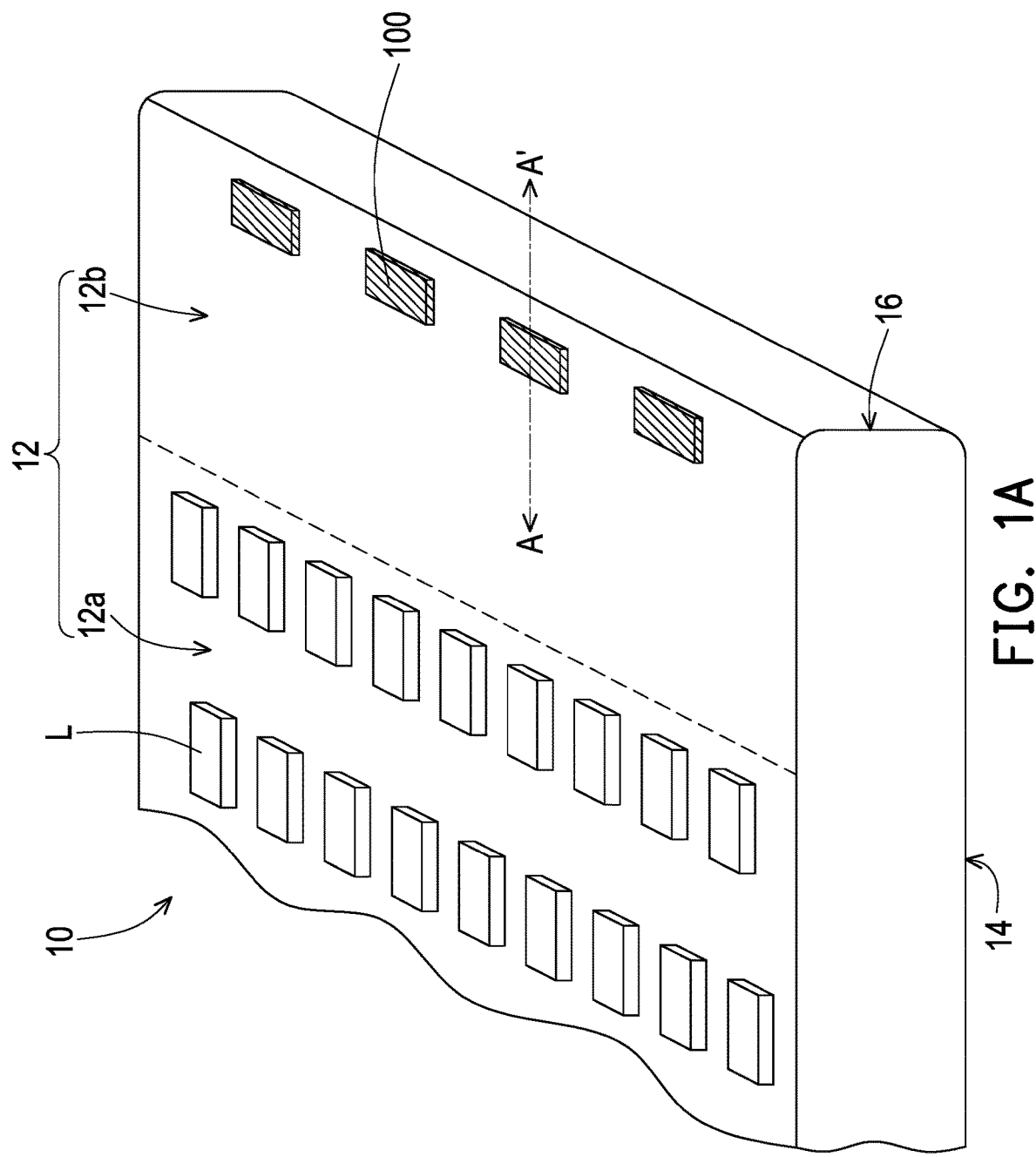
FIG. 1A to FIG. 1E are perspective schematic views of a manufacturing method for a device substrate according to an embodiment of the disclosure.
Figure 2A:
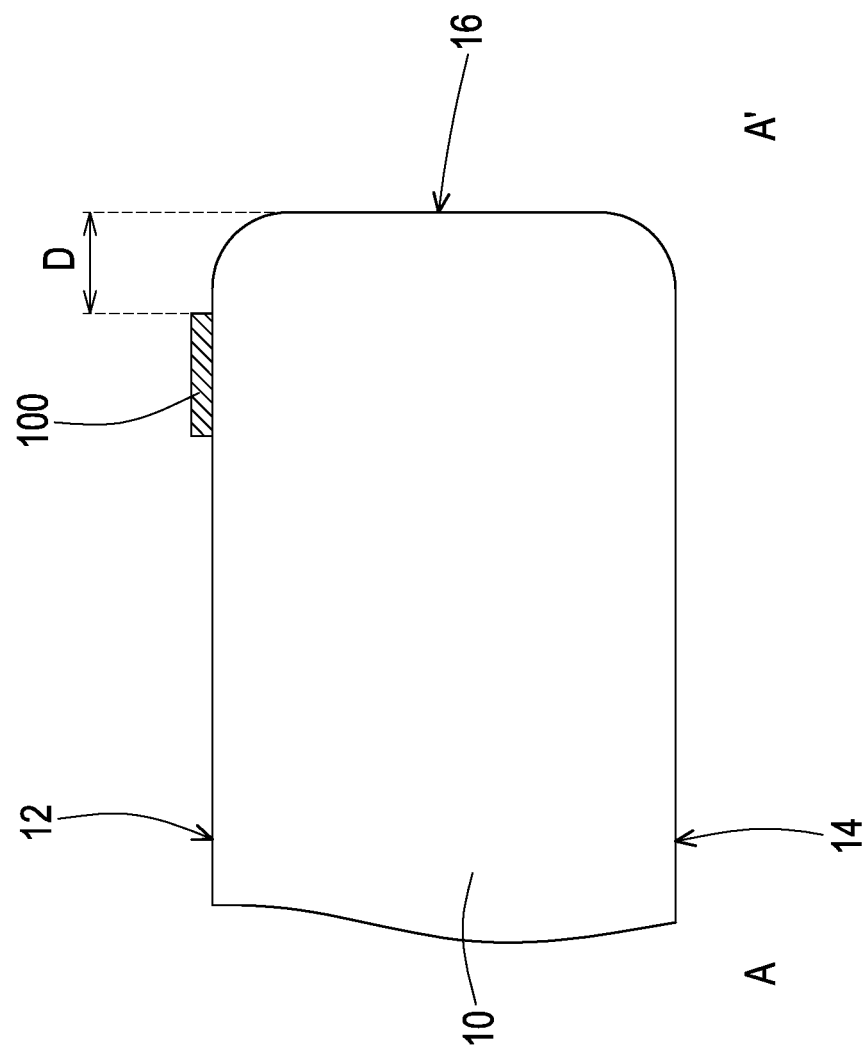
FIG. 2A to FIG. 2E are cross-sectional schematic views at the line A-A' of FIG. 1A to FIG. 1E, respectively.

Referring to FIG. 1A and FIG. 2A, the circuit substrate 10 includes a first surface 12 and a second surface 14 opposite to each other, and a side surface 16 is connected to the first surface 12 and the second surface 14. The first surface 12 of the circuit substrate 10 includes an active zone 12a and a peripheral zone 12b. In some embodiments, multiple light emitting devices L are disposed on the active zone 12a. The light emitting device L is, for example, an organic light emitting diode, an inorganic light emitting diode, or other suitable light emitting devices, but the disclosure is not limited thereto. In other embodiments, other types of electronic devices may be disposed on the active zone 12a. For example, the active zone 12a includes photosensitive devices, touch devices, or other types of electronic devices.

The circuit substrate 10 includes multiple pads 100 installed in the peripheral zone 12b. In some embodiments, some of the pads 100 are electrically connected to the light emitting device L. In this embodiment, the pads 100 do not extend to the edge of the circuit substrate 10, and a distance D is provided between the pads 100 and the edge of the circuit substrate 10, but the disclosure is not limited thereto. In other embodiments, the pads 100 are aligned with the edge of circuit substrate 10. In some embodiments, the edge of the circuit substrate 10 includes rounded corners (chamfers), thereby reducing the probability of the edge of the circuit substrate 10 being damaged due to external force.

Figure 1B:
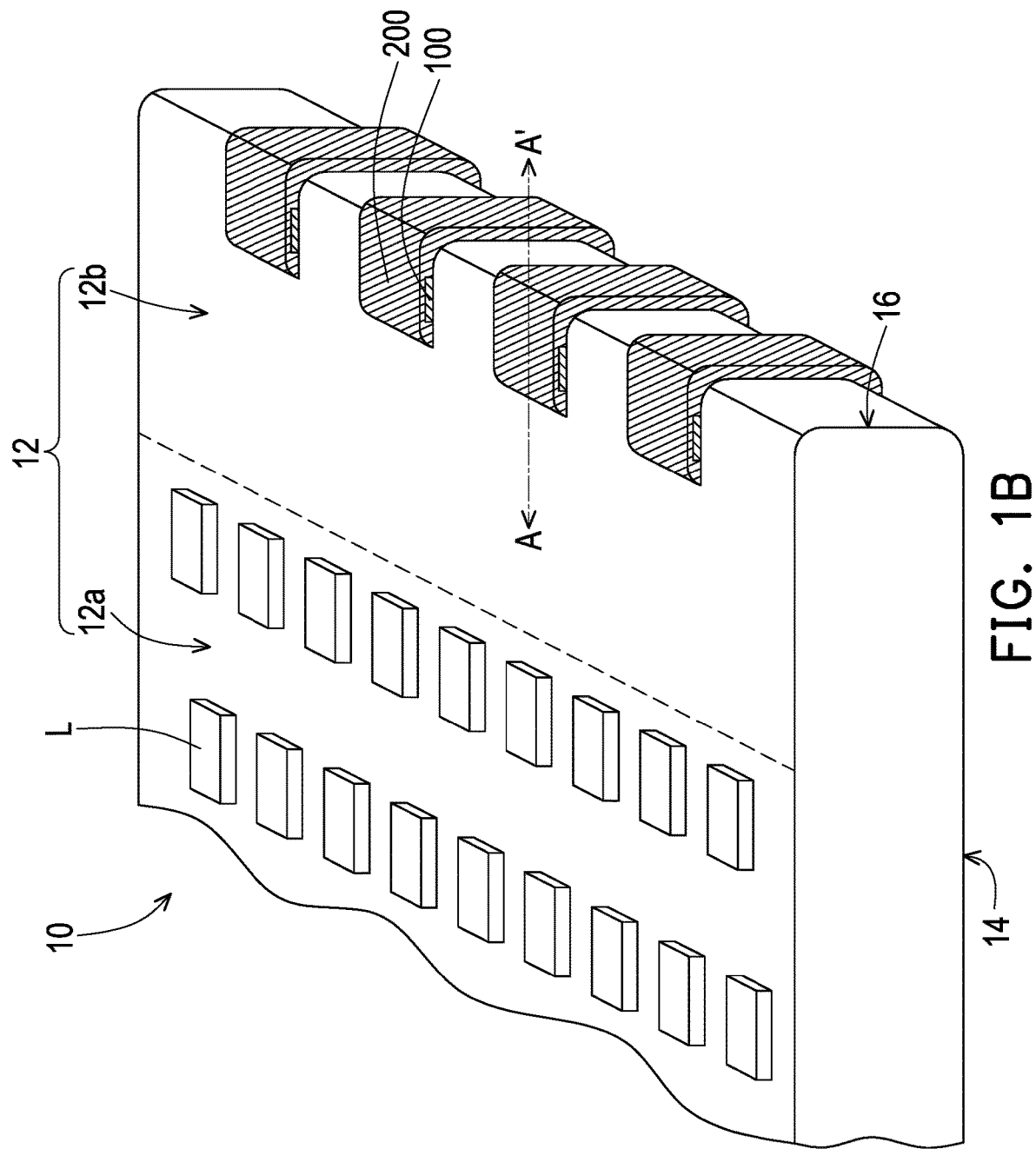
Figure 2B:
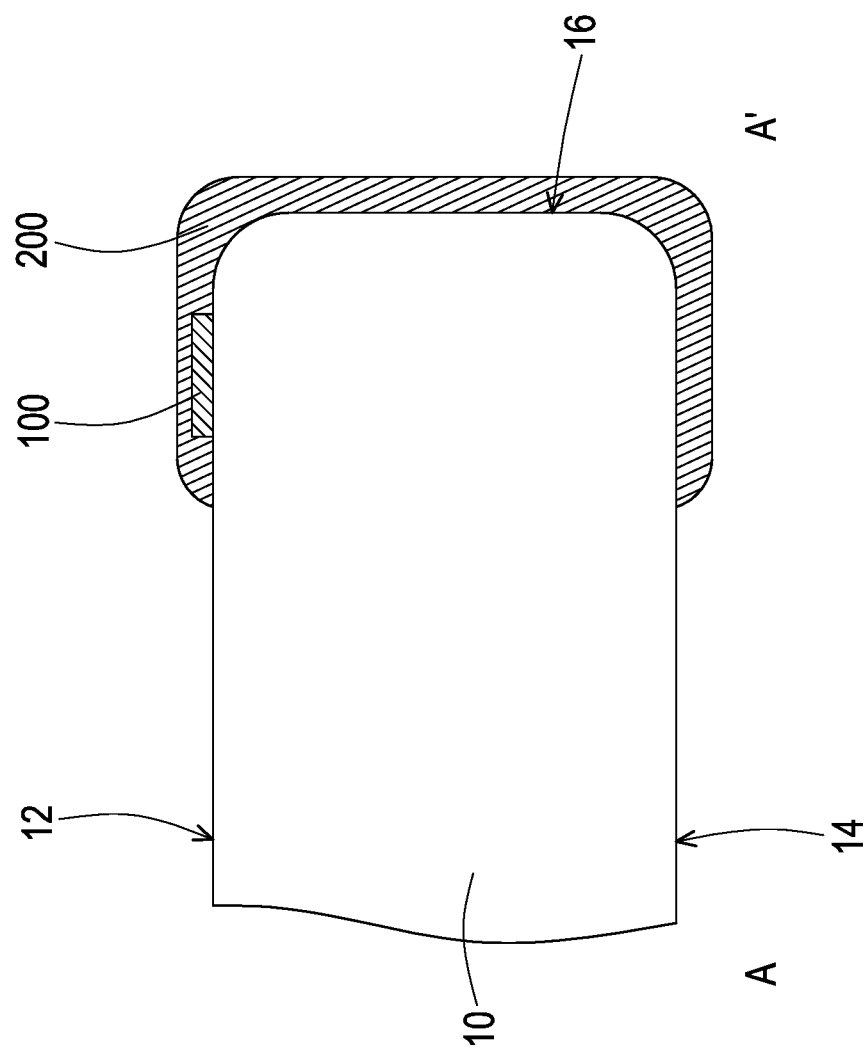

Referring to FIG. 1B and FIG. 2B, multiple first side wirings 200 are formed on the circuit substrate 10. The first side wirings 200 are separated from each other. The first side wirings 200 are formed on the pads 100 and extend from the first surface 12 of the circuit substrate 10 to the second surface 14 of the circuit substrate 10 along the side surface 16 of the circuit substrate 10.

In some embodiments, the first side wiring 200 includes, for example, conductive glue (e.g., silver glue), metal (e.g., copper), or other suitable conductive materials. In some embodiments, the method for forming the first side wiring 200 includes printing, inkjet, or sputtering.

Figure 1C:
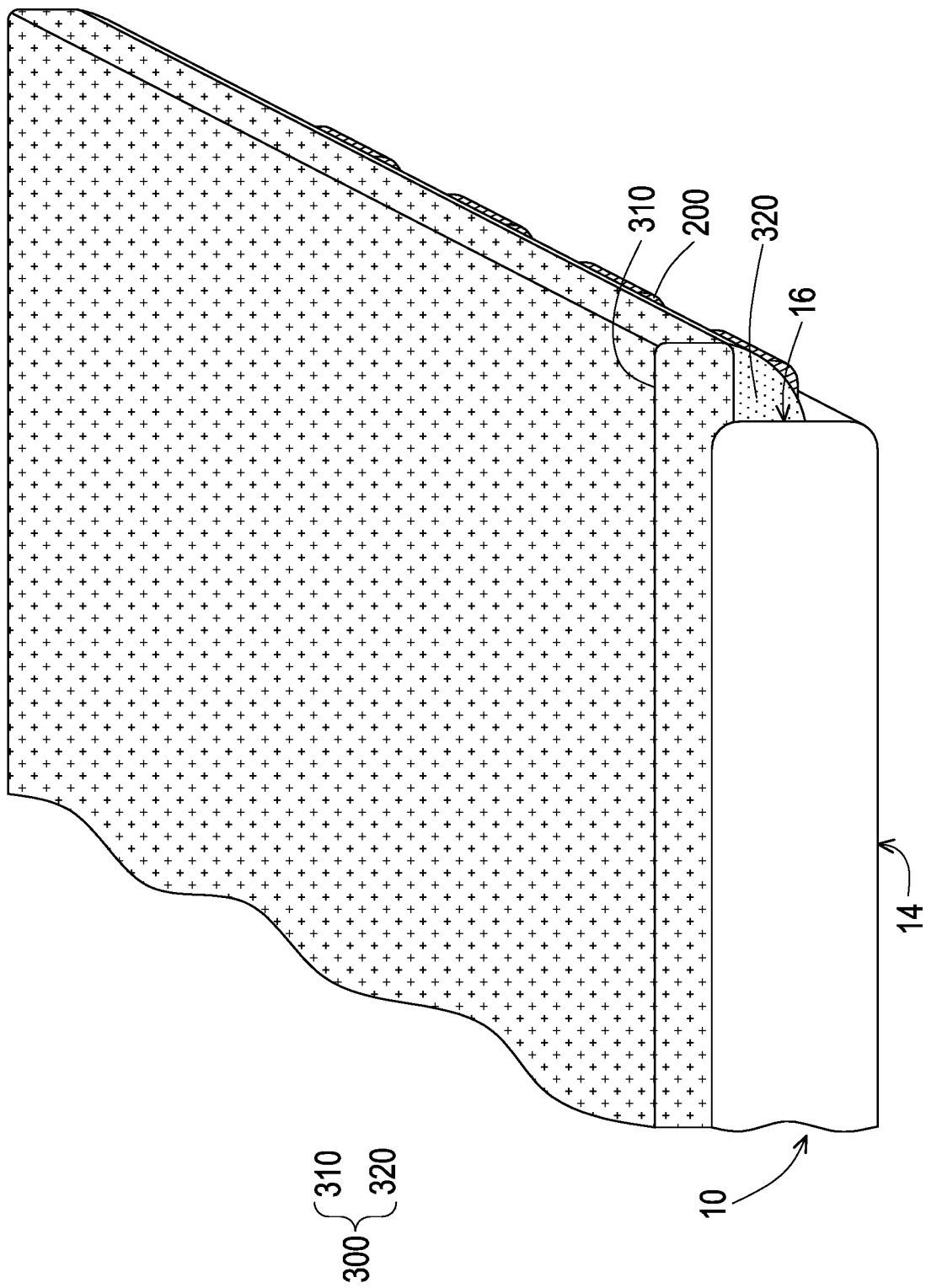
Figure 2C:
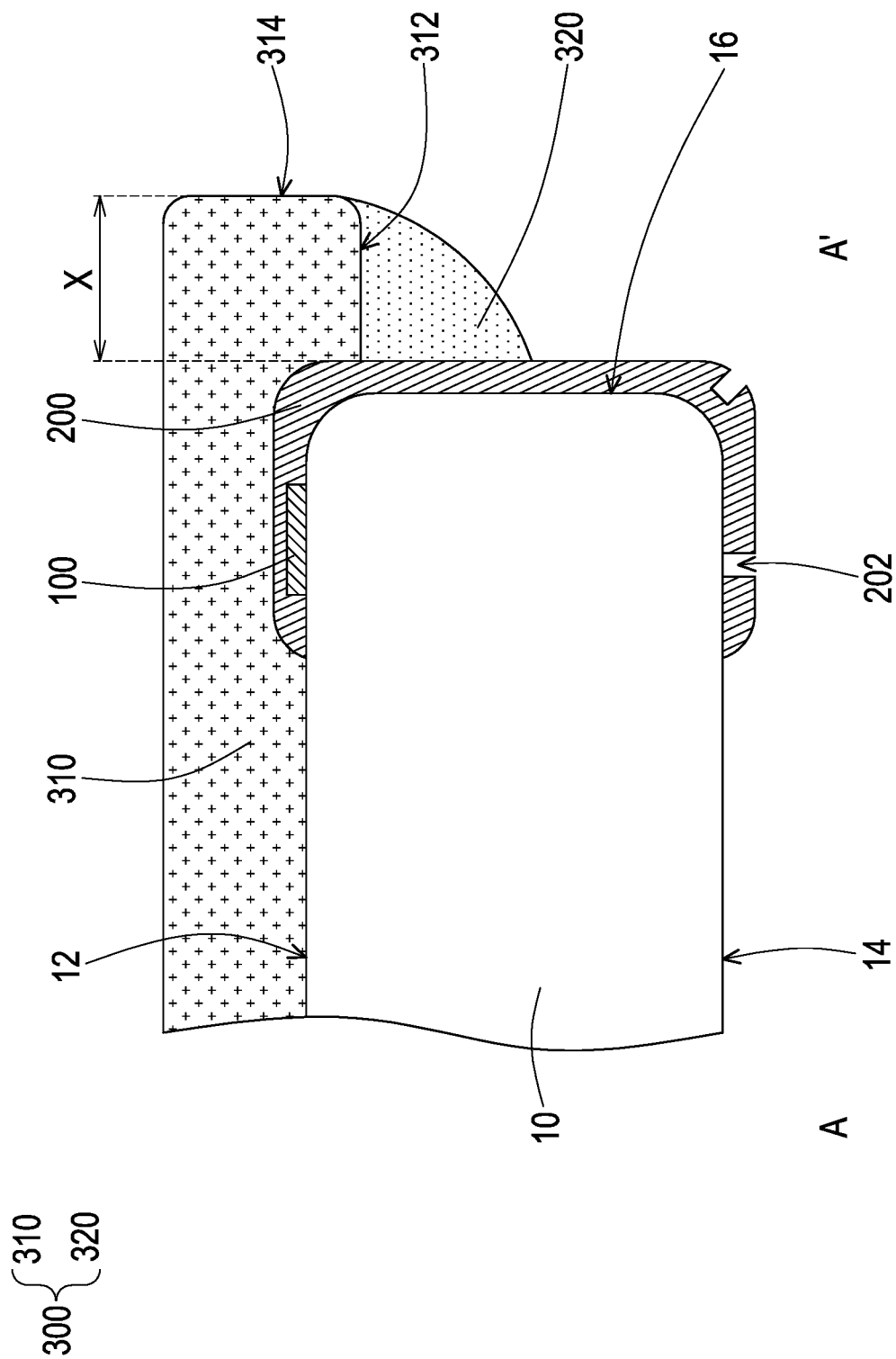

Referring to FIG. 1C and FIG. 2C, the sealant structure 300 is formed on the first surface 12 and the side surface 16 of the circuit substrate 10, and the sealant structure 300 covers the first side wiring 200 on the first surface 12 and a part of the first side wiring 200 on the side surface 16. In this embodiment, the sealant structure 300 includes a mold seal film 310 and a side surface sealant 320. The mold seal film 310 is pasted on the first surface 12 of the circuit substrate 10. In some embodiments, the mold seal film 310 covers the active zone 12a and the peripheral zone 12b of the circuit substrate 10, and covers the light emitting device L and the first side wiring 200 on the first surface 12.

In this embodiment, part of the mold seal film 310 exceeds the side surface 16 of the circuit substrate 10, so that a part of a bottom surface 312 of the mold seal film 310 does not touch the first surface 12 of the circuit substrate 10. In this embodiment, the mold seal film 310 further extends laterally beyond the first side wiring 200 located on the side surface 16, and a distance X beyond is 10 micrometers to 200 micrometers, but the disclosure is not limited thereto.

The side surface sealant 320 covers part of the first side wiring 200 on the side surface 16 of the circuit substrate 10 and exposes another part of the first side wiring 200 on the side surface 16. The side surface sealant 320 is formed on the side surface 16 of the circuit substrate 10 by, for example, dispensing, coating, inkjet, or other suitable methods. In some embodiments, the mold seal film 310 and the side surface sealant 320 include different materials. In this embodiment, the side surface sealant 320 is formed on an included angle between a part of the bottom surface 312 of the mold seal film 310 and the first side wiring 200, so that the side surface sealant 320 is more firmly fixed to the first side wiring 200.

In this embodiment, a part of the first side wiring 200 may be damaged and a crack 202 may be generated before or after the sealant structure 300 is formed. For example, in response to moving the circuit substrate 10 to a different process chamber or processing the same in a process chamber, a part of the first side wiring 200 may be damaged due to collision or friction. In some embodiments, the first side wiring 200 damaged extends continuously or discontinuously from the first surface 12 of the circuit substrate 10 to the second surface 14 of the circuit substrate 10 along the side surface 16 of the circuit substrate 10. In other words, the crack 202 may or may not cause the first side wiring 200 to be disconnected.

Figure 1D:
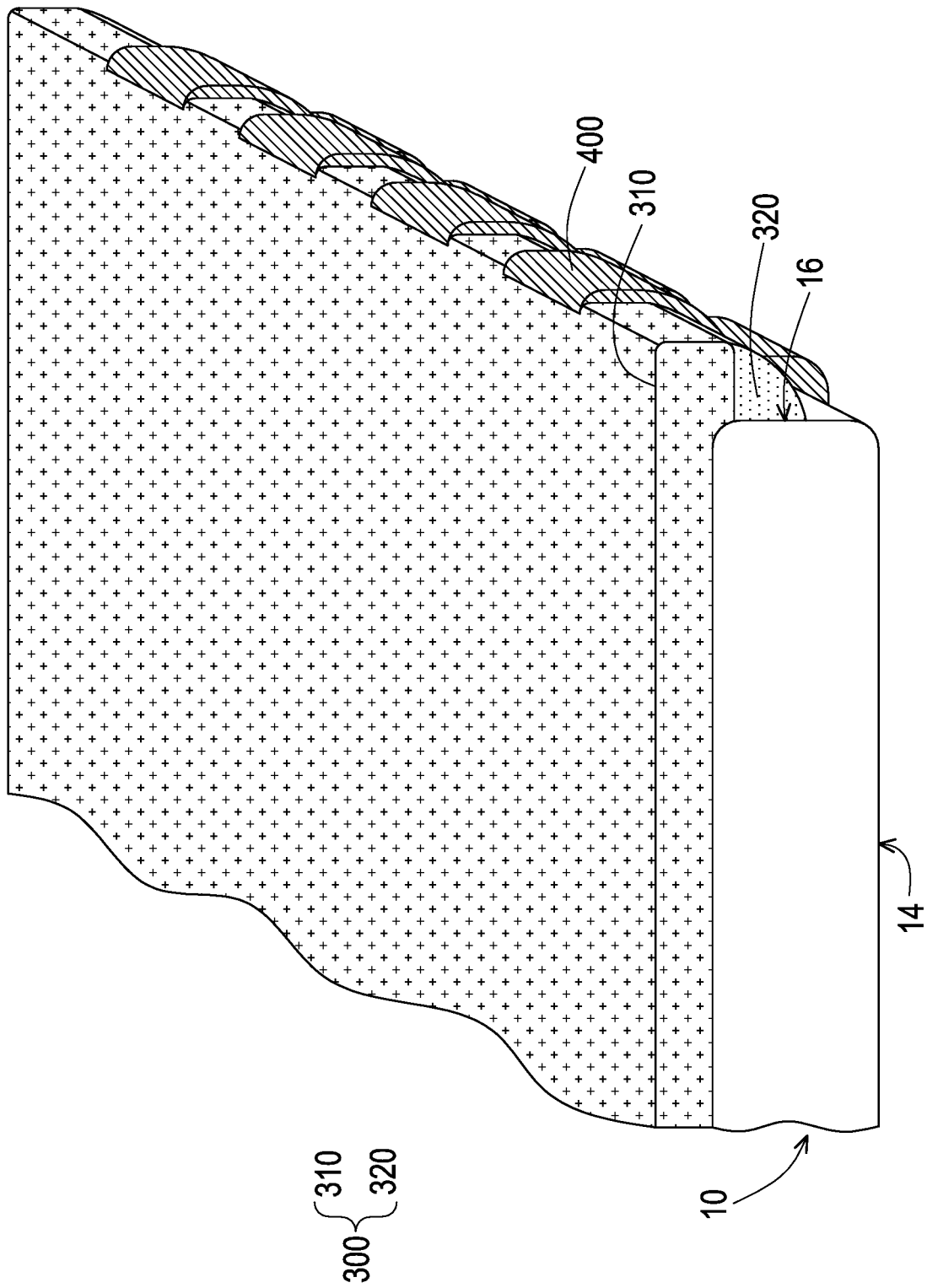
Figure 2D:
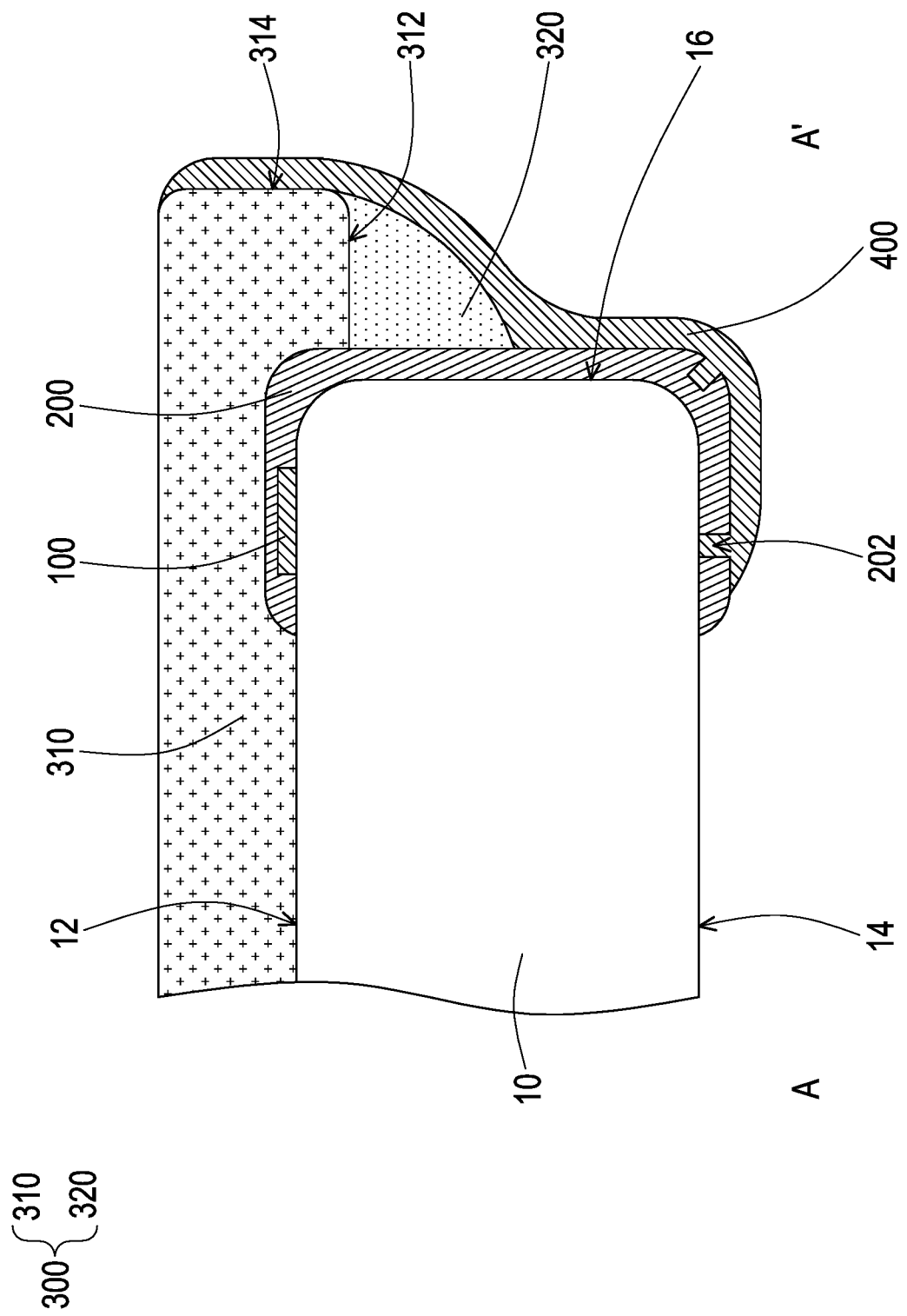

Next, referring to FIG. 1D and FIG. 2D, a second side wiring 400 is formed to repair the first side wiring 200 damaged. In some embodiments, the second side wiring 400 is formed on either the first side wiring 200 damaged or the first side wiring 200 undamaged. In other words, a corresponding second side wiring 400 is formed on each of the first side wirings 200, respectively. The second side wiring 400 extends from the sealant structure 300 to the first side wiring 200 located on the side surface 16 and the second surface 14, and the second side wiring 400 fills the crack 202 of the first side wiring 200. In this embodiment, the side surface sealant 320 is located between the first side wiring 200 and the second side wiring 400. In this embodiment, the second side wiring 400 contacts the side surface 314 of the mold seal film 310, and the second side wiring 400 partially covers the side surface sealant 320.

In some embodiments, the second side wiring 400 includes, for example, conductive glue (e.g., silver glue), metal (e.g., copper), or other suitable conductive materials. In some embodiments, the method for forming the second side wiring 400 includes printing, inkjet, or sputtering.

Figure 1E:
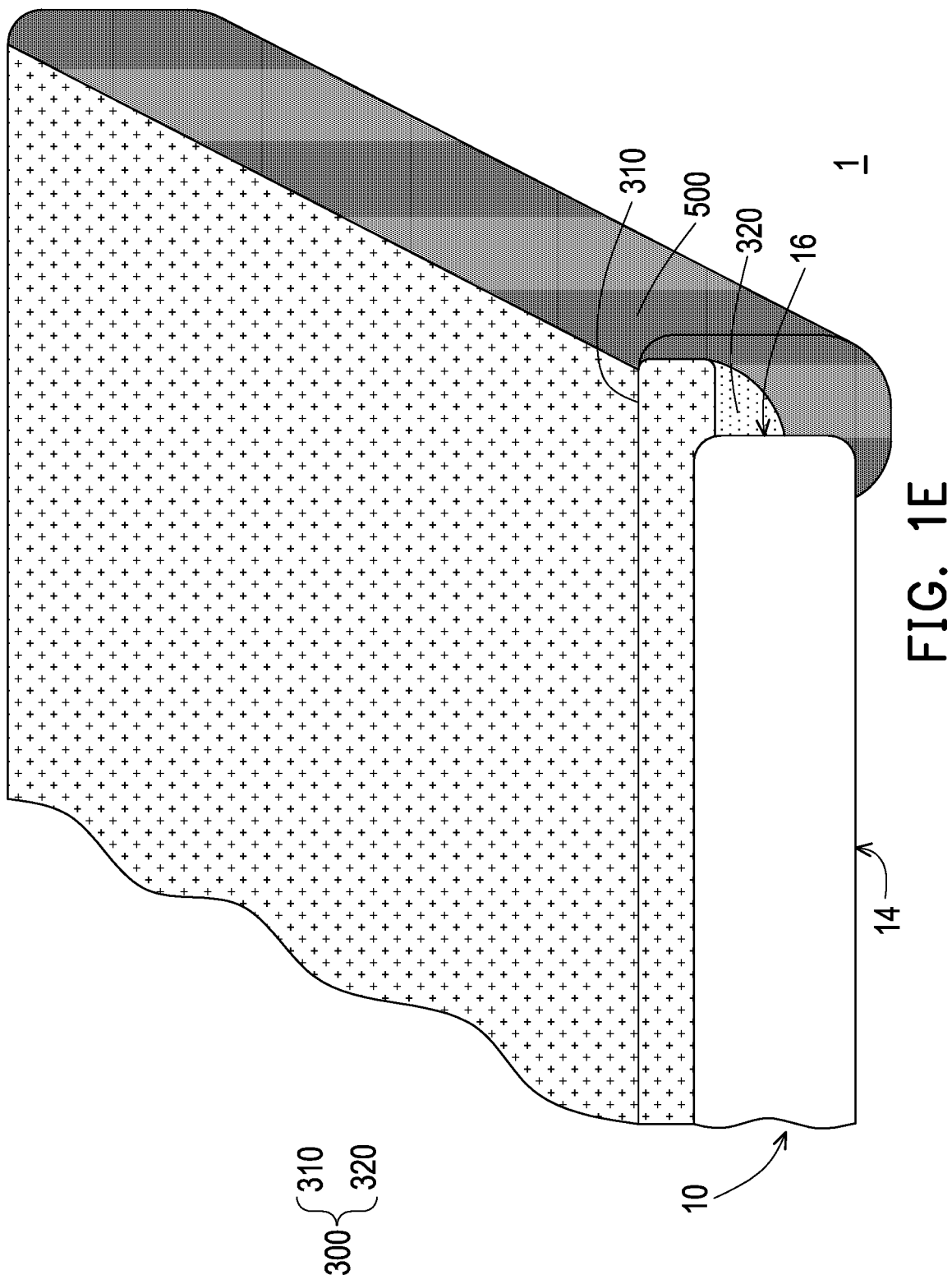
Figure 2E:
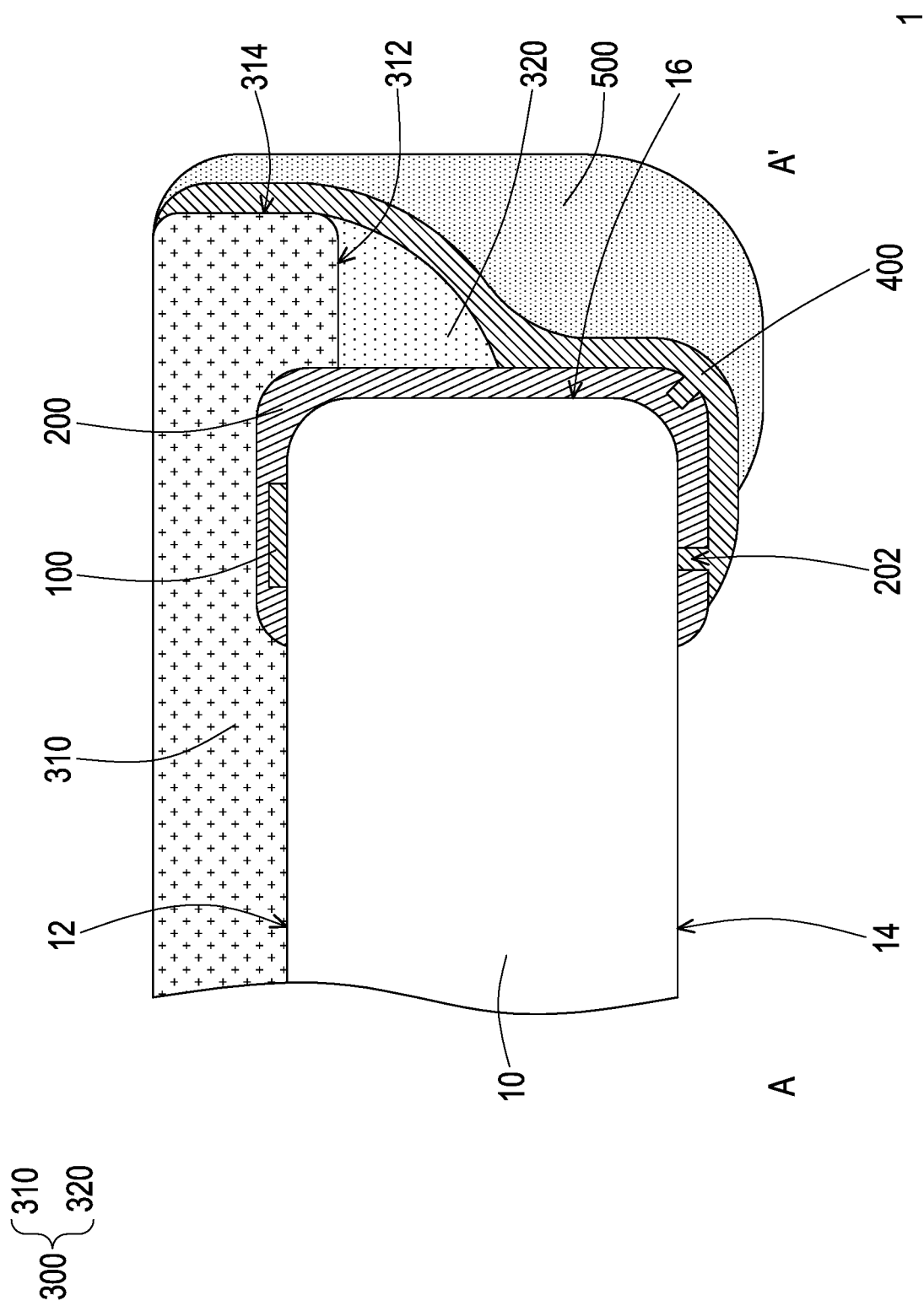

Referring to FIG. 1E and FIG. 2E, a cover layer 500 is formed on the second side wiring 400. The second side wiring 400 is located between the cover layer 500 and the first side wiring 200. In some embodiments, the cover layer 500 includes an insulating material and is configured to protect the second side wiring 400.

Thereby, the device substrate 1 is almost completed. The device substrate 1 includes the circuit substrate 10, the light emitting device L, the first side wiring 200, the sealant structure 300, the second side wiring 400, and the cover layer 500. In some embodiments, a chip (not shown) is electrically connected to the first side wiring 200 and/or the second side wiring 400 on the second surface 14 of the circuit substrate 10. For example, a thin-film flip-chip sealant structure including a driver chip is disposed on the second surface 14 of the circuit substrate 10 and connected to the first side wiring 200 and/or the second side wiring 400 on the second surface 14. In some embodiments, the second surface 14 of the circuit substrate 10 further includes other conductive lines (not shown). The first side wiring 200 and the second side wiring 400 electrically connect the pad 100 to the conductive line on the second surface 14, and the thin-film flip-chip sealant structure is bonded to the conductive line on the second surface 14.

FIG. 3A to FIG. 3E are side views of a manufacturing method for a device substrate according to an embodiment of the disclosure. FIG. 4A to FIG. 4E are cross-sectional schematic views at the line B-B' of FIG. 3A to FIG. 3E, respectively. It must be noted here that the element reference numerals and a portion of the contents of the embodiments of FIG. 1A to FIG. 2E are used in the embodiments of FIG. 3A to FIG. 4E, the same or similar reference numerals are used to denote the same or similar devices, and the description of the same technical content is omitted. For the description of the omitted portion, reference may be made to the foregoing embodiment, and details are not described herein.

Figure 3A:
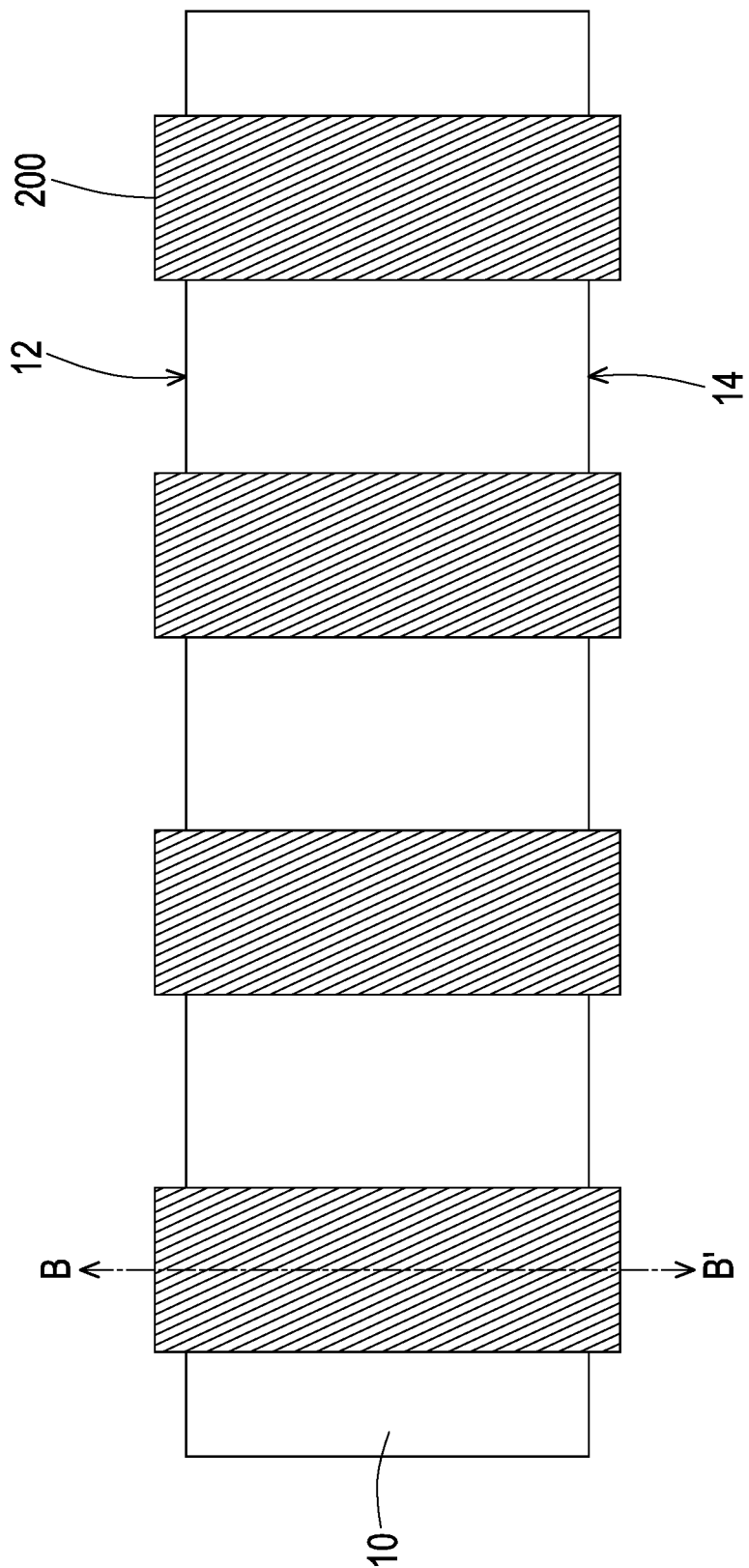
FIG. 3A to FIG. 3E are side views of a manufacturing method for a device substrate according to an embodiment of the disclosure.
Figure 4A:
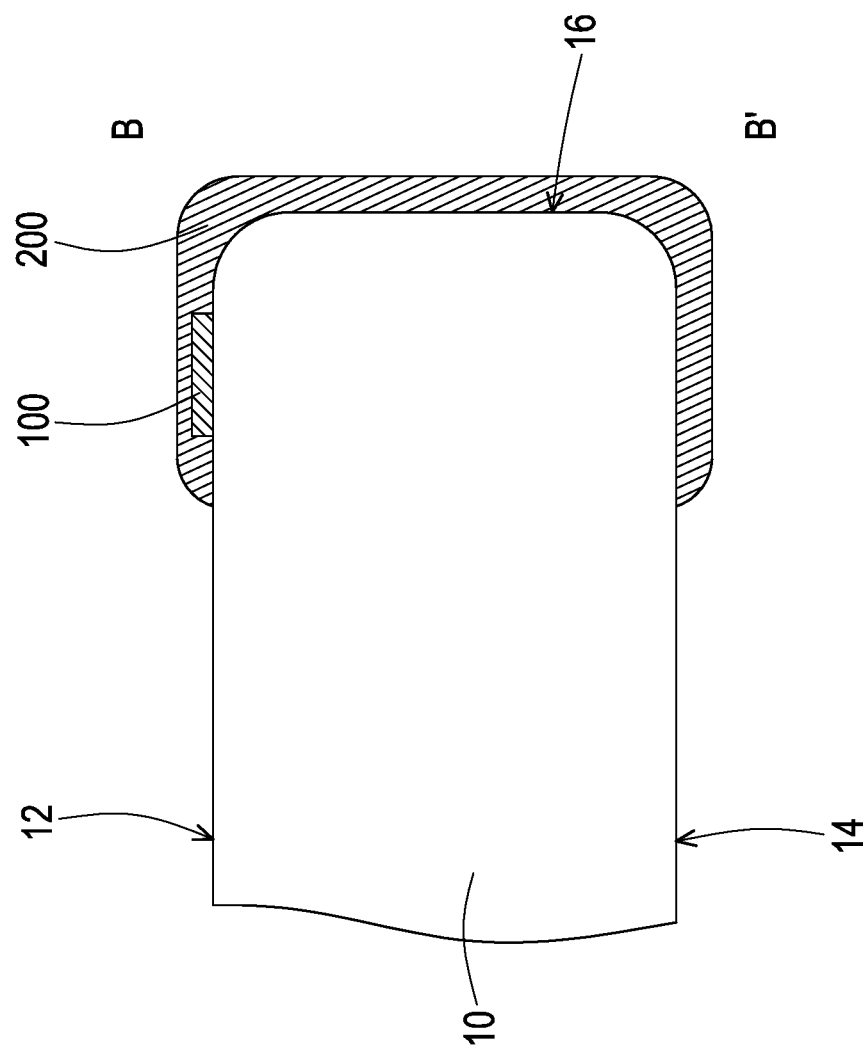
FIG. 4A to FIG. 4E are cross-sectional schematic views at the line B-B' of FIG. 3A to FIG. 3E, respectively.

Referring to FIG. 3A and FIG. 4A, multiple first side wirings 200 are formed on the circuit substrate 10. The first side wirings 200 are separated from each other. The first side wirings 200 are formed on the pads 100 and extend from the first surface 12 of the circuit substrate 10 to the second surface 14 of the circuit substrate 10 along the side surface 16 of the circuit substrate 10.

Figure 3B:
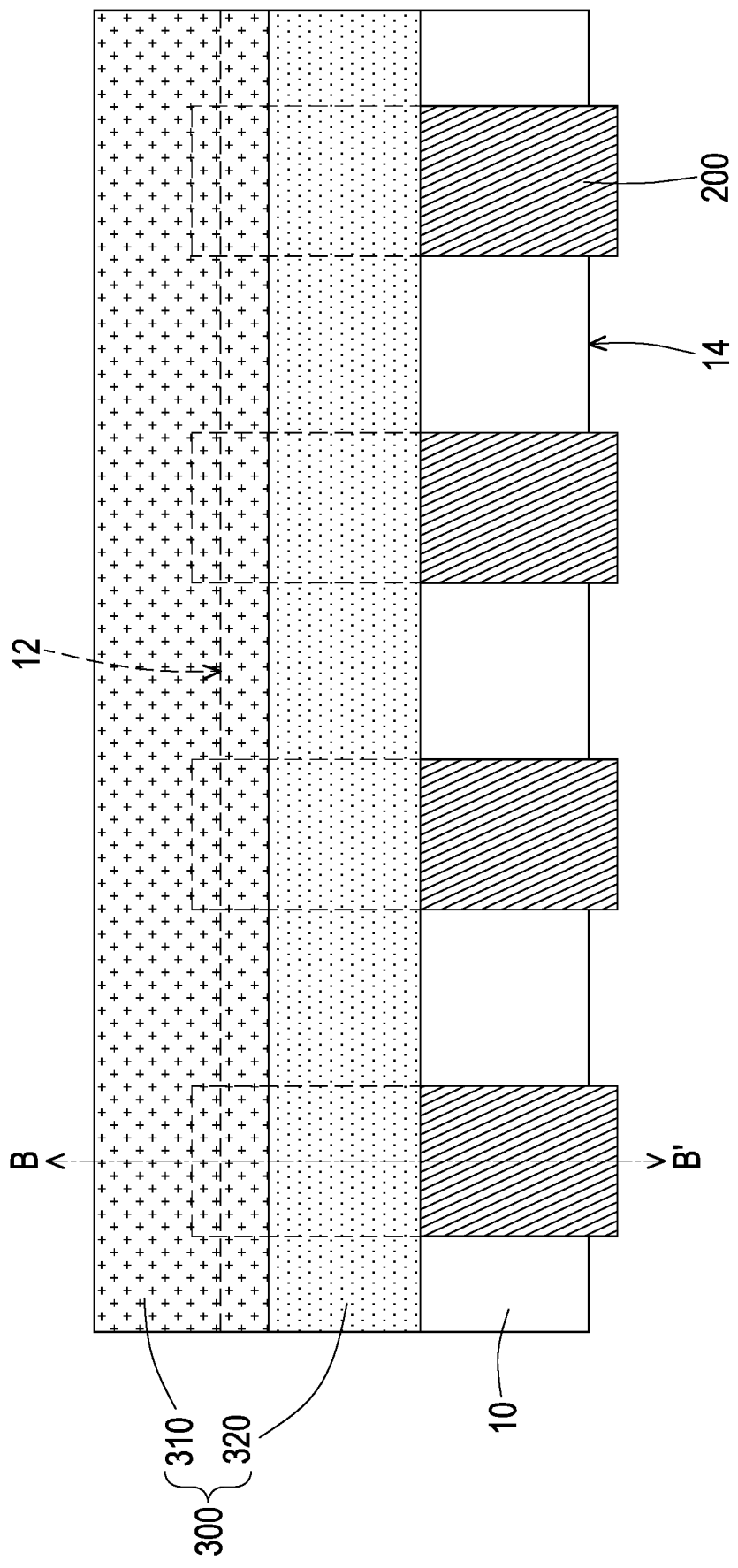
Figure 4B:
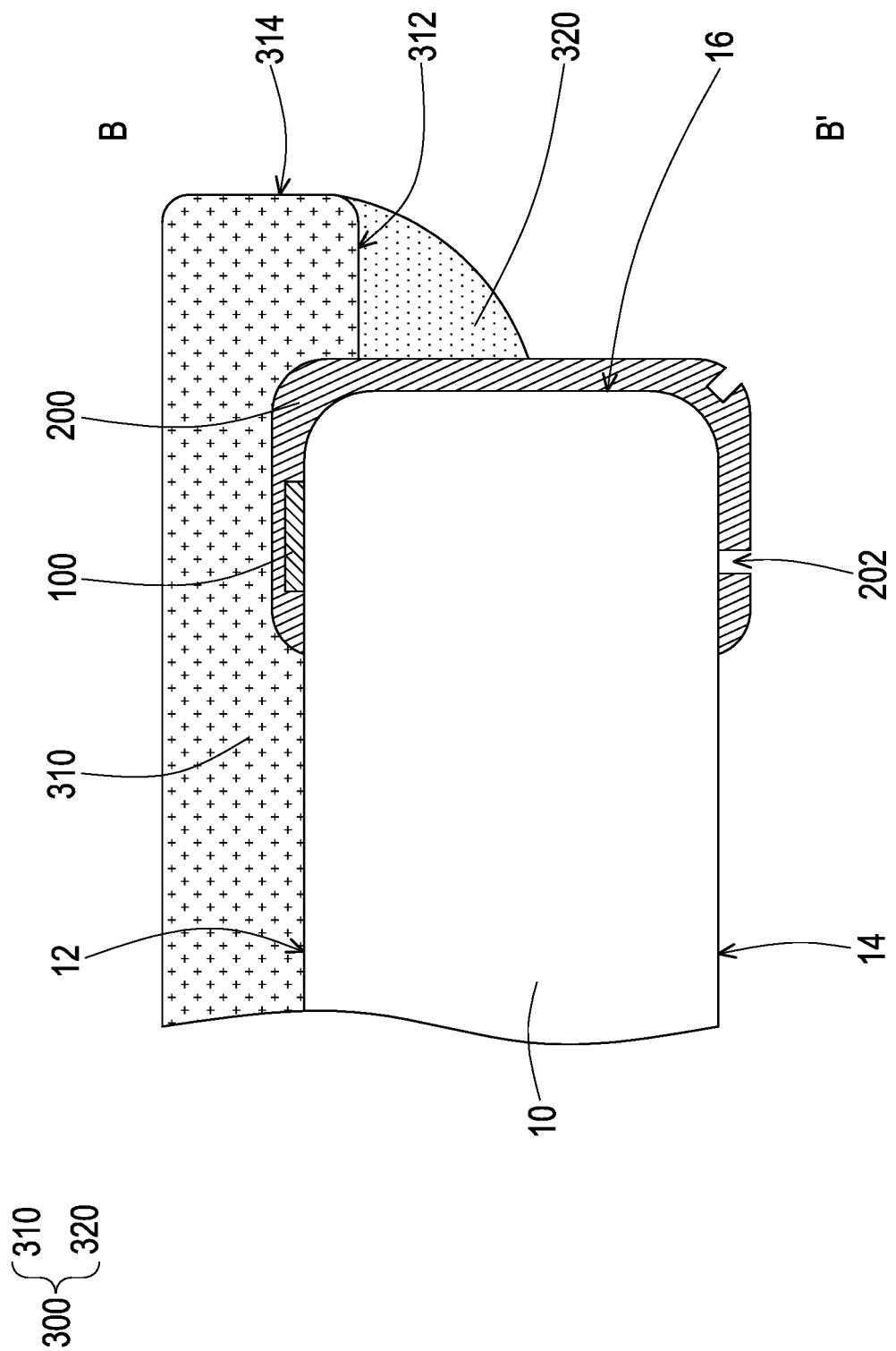

Referring to FIG. 3B and FIG. 4B, the sealant structure 300 is formed on the first surface 12 and the side surface 16 of the circuit substrate 10, and the sealant structure 300 covers the first side wiring 200 on the first surface 12 and a part of the first side wiring 200 on the side surface 16. In this embodiment, the sealant structure 300 includes a mold seal film 310 and a side surface sealant 320. The mold seal film 310 is pasted on the first surface 12 of the circuit substrate 10. In some embodiments, the mold seal film 310 covers the active zone and the peripheral zone of the circuit substrate 10, and covers the light emitting device and the first side wiring 200 on the first surface 12. The side surface sealant 320 covers a part of the first side wiring 200 on the side surface 16.

A part of the first side wiring 200 may be damaged and a crack 202 may be generated before or after the sealant structure 300 is formed. For example, in response to moving the circuit substrate 10 to a different process chamber or processing the same in a process chamber, a part of the first side wiring 200 may be damaged due to collision or friction. In some embodiments, the first side wiring 200 damaged extends continuously or discontinuously from the first surface 12 of the circuit substrate 10 to the second surface 14 of the circuit substrate 10 along the side surface 16 of the circuit substrate 10.

Figure 3C:
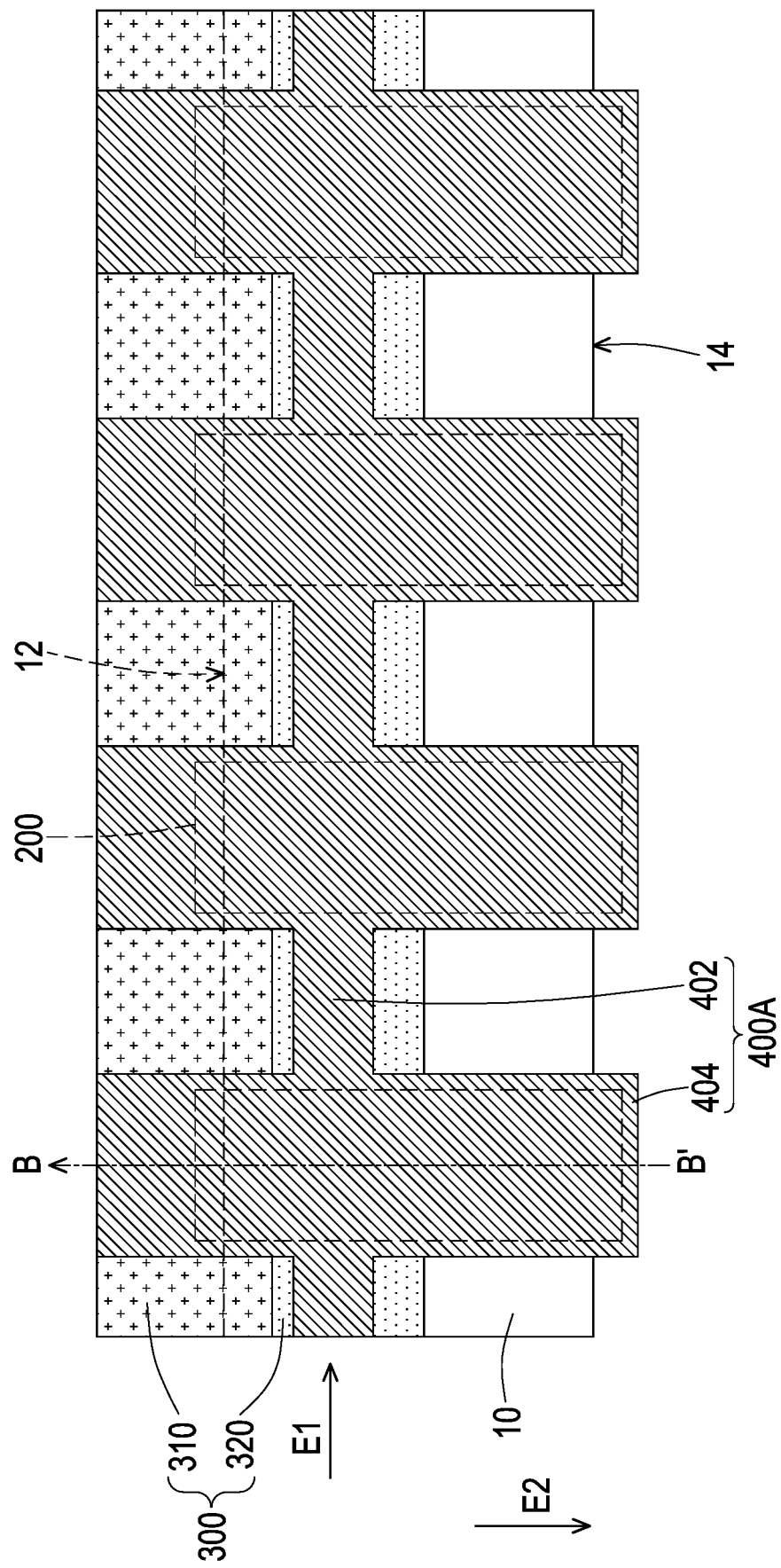
Figure 4C:
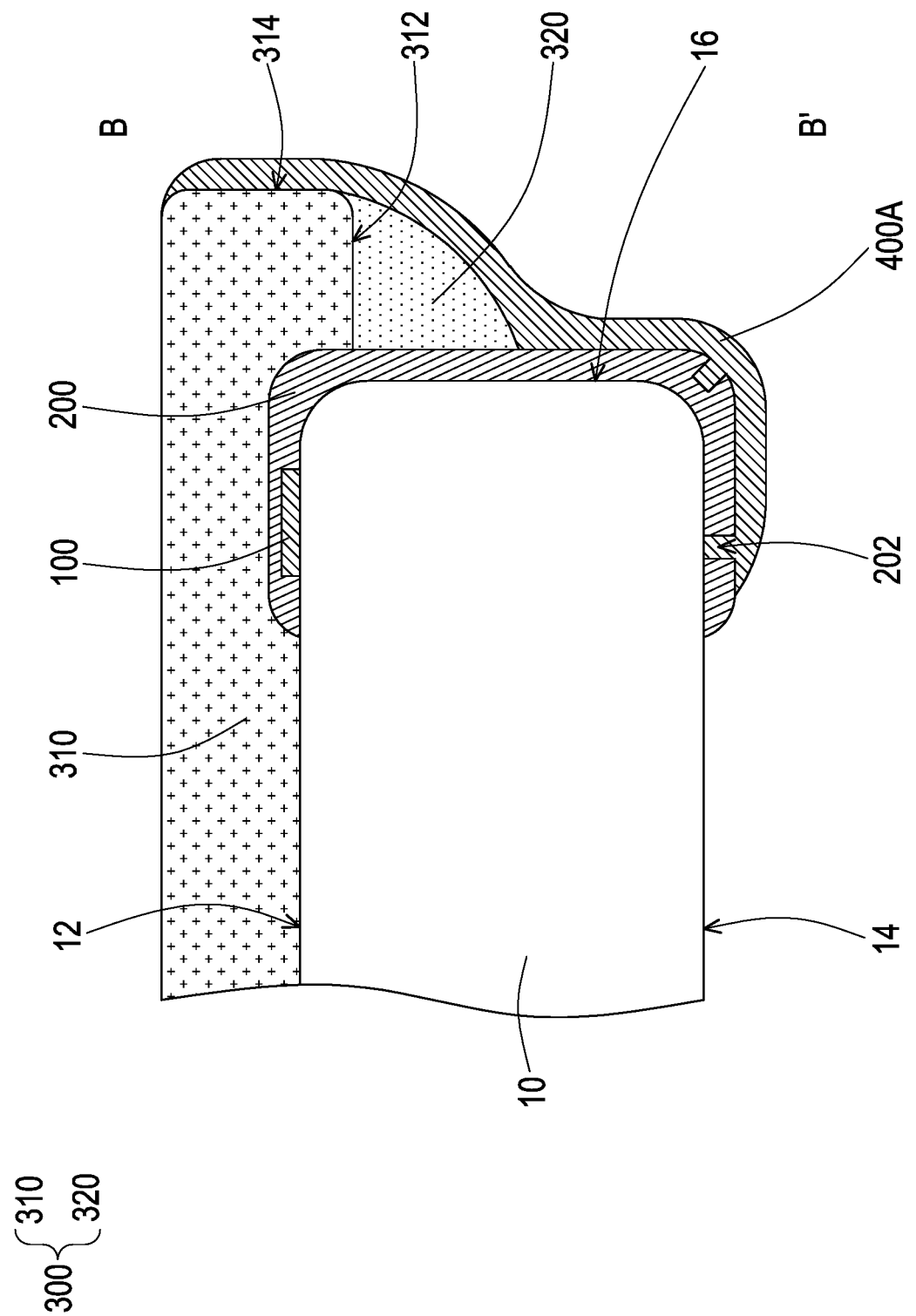

Referring to FIG. 3C and FIG. 4C, a shorting bar 400A is formed to repair the first side wiring 200 damaged. In some embodiments, the shorting bar 400A is formed on either the first side wiring 200 damaged or the first side wiring 200 undamaged. The shorting bar 400A is electrically connected to multiple first side wirings 200 and is electrically connected to multiple pads 100 through the first side wirings 200.

The shorting bar 400A extends from the sealant structure 300 to the first side wiring 200 located on the side surface 16 and the second surface 14, and the shorting bar 400A fills the crack 202 of the first side wiring 200. In this embodiment, the side surface sealant 320 is located between the first side wiring 200 and the shorting bar 400A. In this embodiment, the shorting bar 400A contacts the side surface 314 of the mold seal film 310, and the shorting bar 400A partially covers the side surface sealant 320. In some embodiments, the shorting bar 400A includes a trunk portion 402 extending along a first direction E1 and multiple branch portions 404 extending along a second direction E2. The trunk portion 402 connects the branch portions 404 together, and each of the branch portions 404 covers a corresponding first side wiring 200. In some embodiments, the first direction E1 is perpendicular to the second direction E2.

In some embodiments, the shorting bar 400A includes, for example, conductive glue (e.g., silver glue), metal (e.g., copper), or other suitable conductive materials. In some embodiments, the method for forming the shorting bar 400A includes printing, inkjet, or sputtering.

Figure 3D:
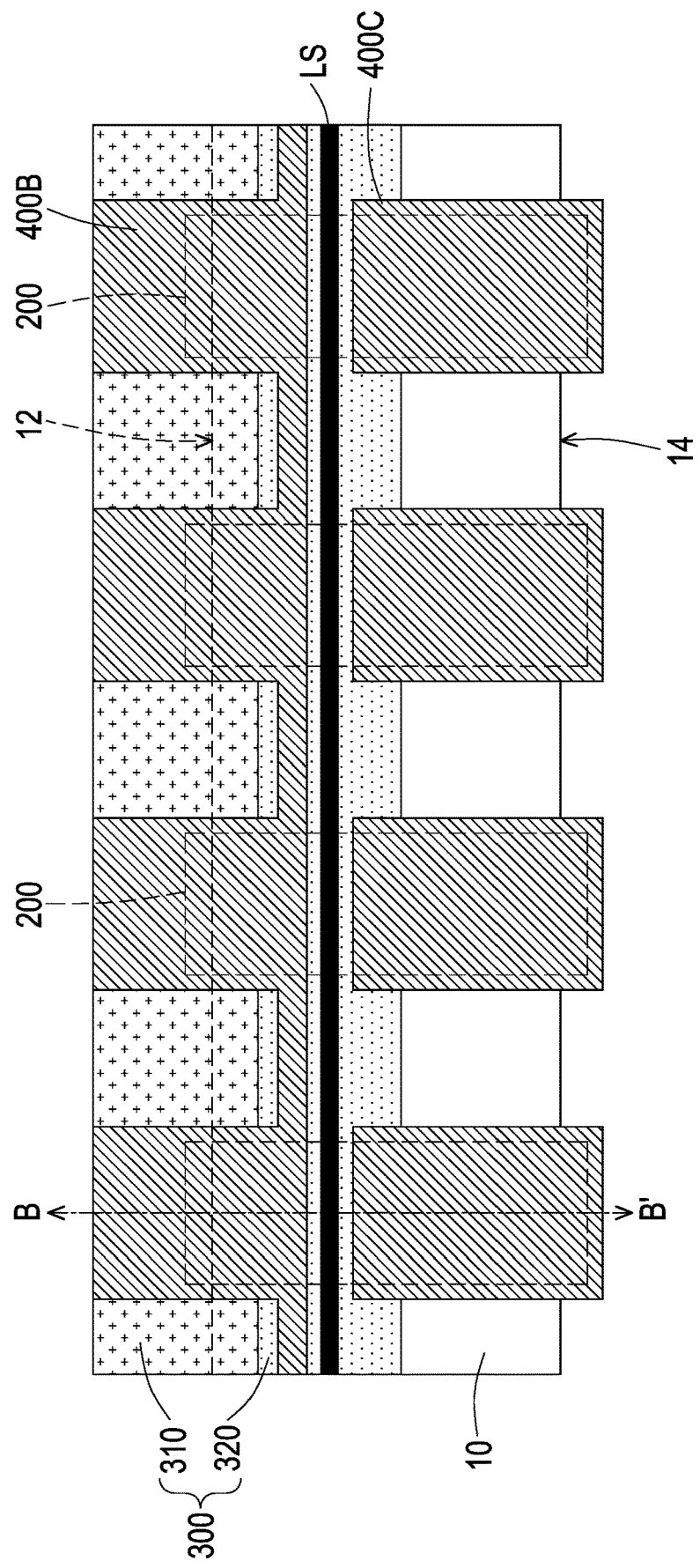
Figure 4D:
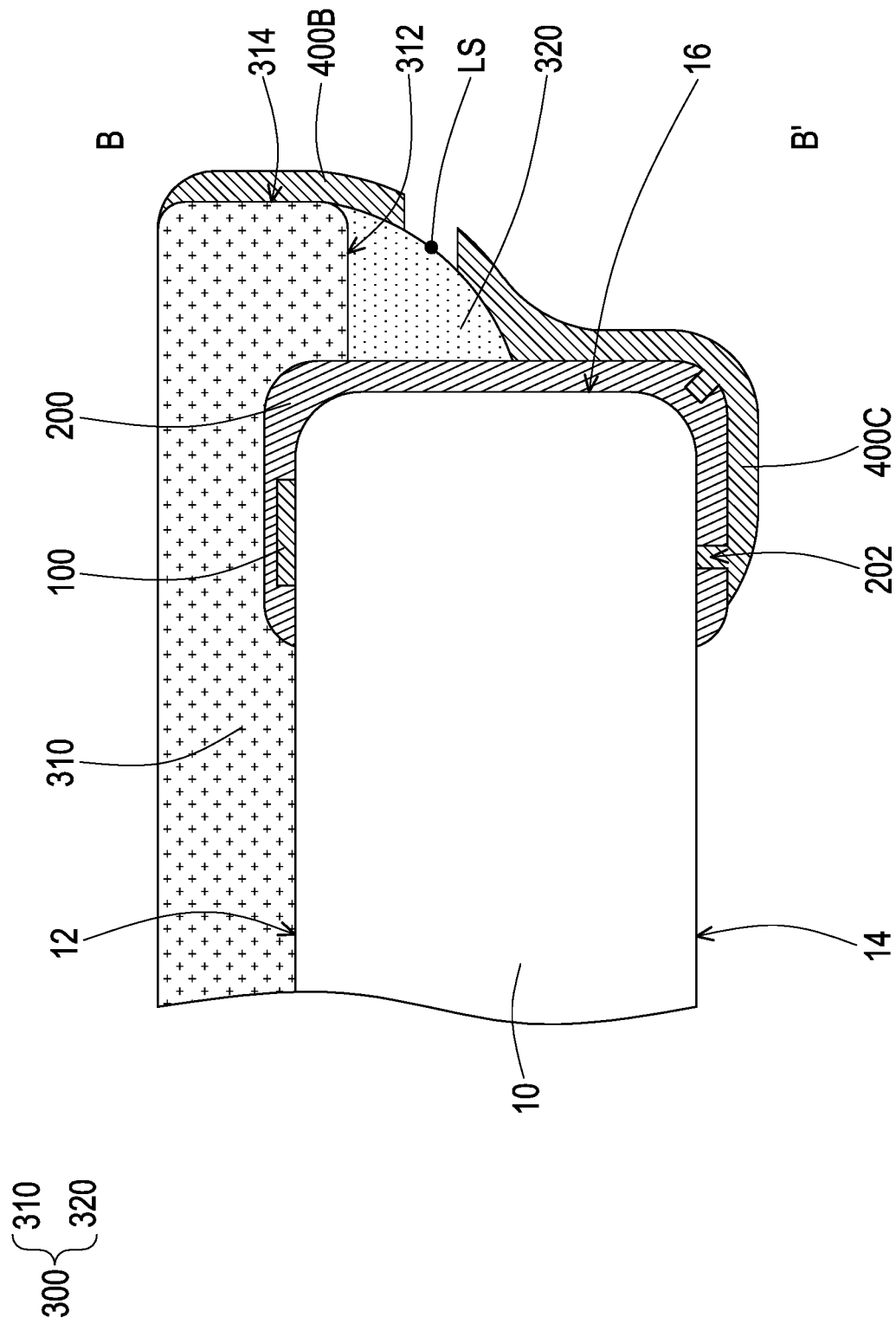

Referring to FIG. 3D and FIG. 4D, the shorting bar 400A is cut with laser to form multiple second side wirings 400C and a conducting bar 400B separated from each other. Cutting with laser prevents multiple pads 100 from being electrically connected to each other through the shorting bar 400A. The laser forms laser cut LS on the sealant structure 300. For example, the laser cut LS is located on the side surface sealant 320 and extends along the first direction E1. The laser cut LS is located between the conducting bar 400B and the second side wiring 400C. The second side wiring 400C is electrically connected to the first side wiring 200, respectively, and may repair the crack 202 in the first side wiring 200.

Figure 3E:
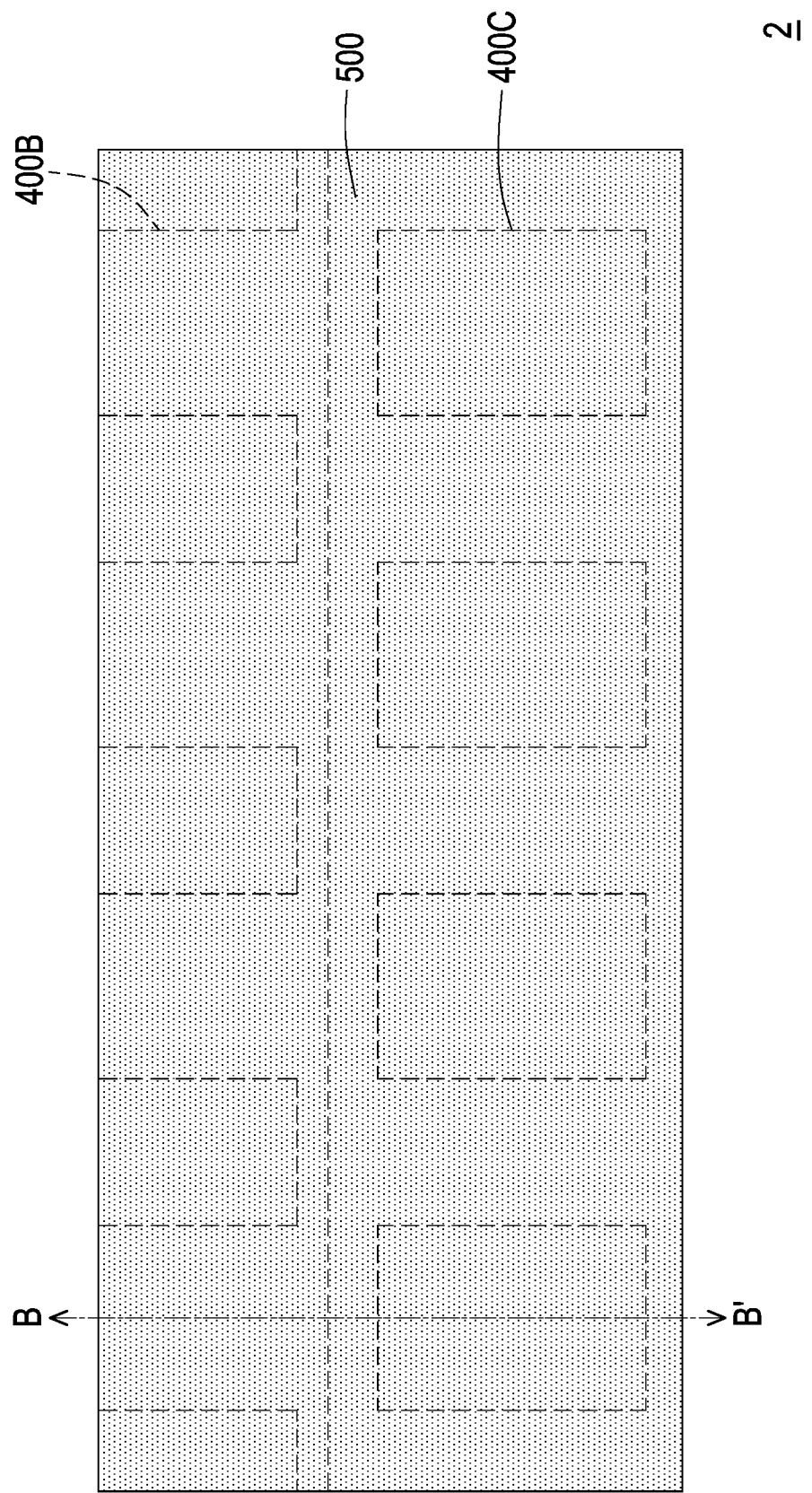
Figure 4E:
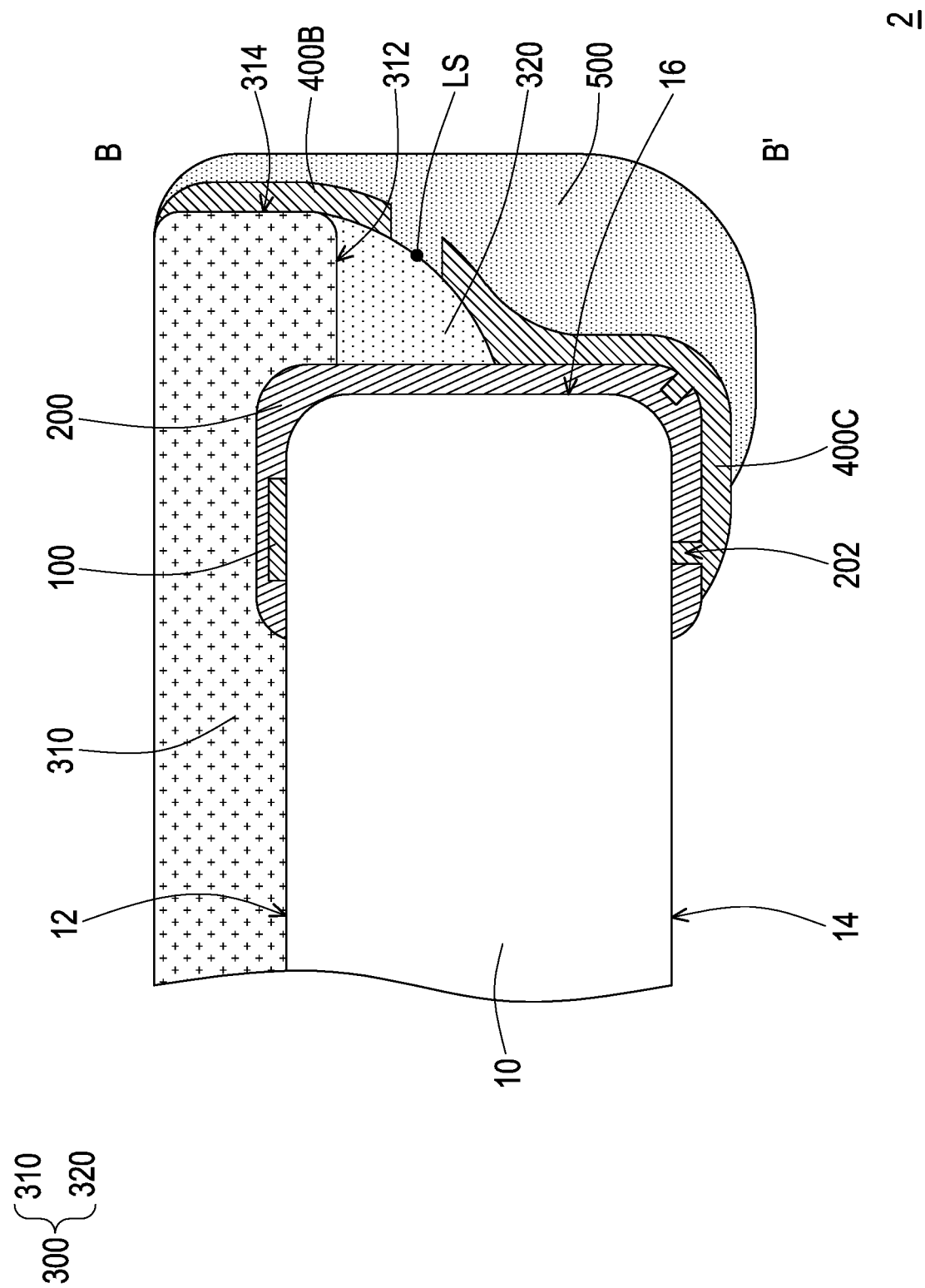

Referring to FIG. 3E and FIG. 4E, a cover layer 500 is formed on the second side wiring 400. The second side wiring 400C is located between the cover layer 500 and the first side wiring 200. In some embodiments, the cover layer 500 includes an insulating material and is configured to protect the second side wiring 400C.

Thereby, a device substrate 2 is almost completed. The device substrate 2 includes the circuit substrate 10, the light emitting device (not shown), the first side wiring 200, the sealant structure 300, the second side wiring 400C, the conducting bar 400B, and the cover layer 500.

What is claimed is:

1. A device substrate, comprising:
   a circuit substrate;
   a first side wiring, extending from a first surface of the circuit substrate to a second surface of the circuit substrate along a side surface of the circuit substrate;
   a sealant structure, located above the first surface and covering the first side wiring on the first surface;
   a second side wiring, extending from the sealant structure to the first side wiring located on the side surface and the second surface; and
   a cover layer, wherein the second side wiring is located between the cover layer and the first side wiring.

2. The device substrate according to claim 1, wherein the sealant structure comprises a side surface sealant, and a laser cut is located on the side surface sealant.

3. The device substrate according to claim 2, further comprising:
   a conducting bar, located on the sealant structure and separated from the second side wiring, wherein the laser cut is located between the conducting bar and the second side wiring.

4. The device substrate according to claim 1, wherein the sealant structure comprises:
   a mold seal film, covering the first side wiring on the first surface; and
   a side surface sealant, covering a part of the first side wiring on the side surface, wherein the side surface sealant is located between the first side wiring and the second side wiring.

5. The device substrate according to claim 1, wherein the first side wiring comprises a crack, and the second side wiring is filled in the crack.

6. The device substrate according to claim 1, wherein the first side wiring extends continuously from the first surface of the circuit substrate to the second surface of the circuit substrate along the side surface of the circuit substrate.

7. The device substrate according to claim 1, wherein the first side wiring extends discontinuously from the first surface of the circuit substrate to the second surface of the circuit substrate along the side surface of the circuit substrate.

8. A manufacturing method for a device substrate, comprising:
   forming a first side wiring on a circuit substrate, wherein the first side wiring extends from a first surface of the circuit substrate to a second surface of the circuit substrate along a side surface of the circuit substrate;
   forming a sealant structure above the first surface, wherein the sealant structure covers the first side wiring on the first surface, and wherein the first side wiring is damaged before or after forming the sealant structure;
   forming a second side wiring to repair the first side wiring damaged, wherein the second side wiring extends from the sealant structure to the first side wiring located on the side surface and the second surface; and forming a cover layer, wherein the second side wiring is located between the cover layer and the first side wiring.

9. The manufacturing method for the device substrate according to claim 8, wherein a method for forming the first side wiring and a method for forming the second side wiring comprise printing, inkjet, or sputtering.

10. The manufacturing method for the device substrate according to claim 8, wherein the method for forming the second side wiring comprises:
forming a shorting bar connecting the first side wiring; and
cutting the shorting bar with laser to form the second side wiring and a conducting bar separated from each other, wherein the laser forms a laser cut on the sealant structure, and the laser cut is located between the conducting bar and the second side wiring.

11. The manufacturing method for the device substrate according to claim 8, wherein a method for forming the sealant structure comprises:
forming a mold seal film on the first surface; and
forming a side surface sealant on the side surface, wherein the sealant structure comprises the mold seal film and the side surface sealant, and the side surface sealant is located between the first side wiring and the second side wiring.

12. A manufacturing method for a device substrate, comprising:
forming a plurality of first side wirings on a circuit substrate, wherein the first side wirings extend from a first surface of the circuit substrate to a second surface of the circuit substrate along a side surface of the circuit substrate;
forming a sealant structure above the first surface, wherein the sealant structure covers the first side wirings on the first surface;
forming a shorting bar on the first side wirings, wherein a part of the shorting bar extends from the sealant structure to the first side wirings located on the side surface and the second surface;
cutting the shorting bar with laser to form a plurality of second side wirings separated from each other, wherein the second side wirings are electrically connected to the first side wirings, respectively; and
forming a cover layer, wherein the plurality of second side wirings are located between the cover layer and the plurality of first side wirings.

13. The manufacturing method for the device substrate according to claim 12, wherein the shorting bar is cut with laser to form the second side wirings and a conducting bar separated from each other, wherein the laser forms a laser cut on the sealant structure, and the laser cut is located between the conducting bar and the second side wirings.

14. The manufacturing method for the device substrate according to claim 12, wherein the shorting bar comprises a trunk portion extending along a first direction and a plurality of branch portions extending along a second direction, and wherein the trunk portion connects the branch portions together, and each of the branch portions covers a corresponding first side wiring.

* * * * *